United States Patent
Hiraoka et al.

(10) Patent No.: US 10,358,734 B2
(45) Date of Patent: Jul. 23, 2019

(54) NICKEL SOLUTION FOR FORMING FILM AND FILM-FORMING METHOD USING SAME

(71) Applicant: TOYOTA JIDOSHA KABUSHIKI KAISHA, Toyota-shi, Aichi (JP)

(72) Inventors: Motoki Hiraoka, Toyota (JP); Hiroshi Yanagimoto, Miyoshi (JP); Yuki Sato, Nisshin (JP); Yoshitaka Shimmei, Nagoya (JP); Kensuke Akamatsu, Nagaokakyo (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/026,366

(22) PCT Filed: Oct. 2, 2014

(86) PCT No.: PCT/JP2014/076378
§ 371 (c)(1),
(2) Date: Mar. 31, 2016

(87) PCT Pub. No.: WO2015/050192
PCT Pub. Date: Apr. 9, 2015

(65) Prior Publication Data
US 2016/0237582 A1  Aug. 18, 2016

(30) Foreign Application Priority Data

Oct. 3, 2013  (JP) .................................. 2013-208418
Jul. 22, 2014  (JP) .................................. 2014-148882

(51) Int. Cl.
*C25D 3/12* (2006.01)
*C25D 5/00* (2006.01)
(Continued)

(52) U.S. Cl.
CPC ................. *C25D 5/00* (2013.01); *C25D 3/00* (2013.01); *C25D 3/12* (2013.01); *C25D 7/12* (2013.01);
(Continued)

(58) Field of Classification Search
CPC ....................................................... C25D 3/12
(Continued)

(56) References Cited

U.S. PATENT DOCUMENTS 2,351,966 A    6/1944  Hogaboom et al.
2,721,814 A *  10/1955  Jendrzynski ............ C23C 18/36
                                                106/1.27
(Continued)

FOREIGN PATENT DOCUMENTS

CN   103088375 A    5/2013
GB       963335 A    7/1964
(Continued)

OTHER PUBLICATIONS

Watanabe et al., "Investigation for Substitution Agents of Boric Acid in Nickel Sulfamate Bath," Hyomen Gijutsu (no month, 2007), vol. 58, No. 5, pp. 317-324. Abstract only. (Year: 2007).*
(Continued)

*Primary Examiner* — Edna Wong
(74) *Attorney, Agent, or Firm* — Sughrue Mion, PLLC

(57) ABSTRACT

A nickel solution for forming a film that can suppress generation of hydrogen gas between a solid electrolyte membrane and a substrate while the solid electrolyte membrane and the substrate are brought into contact with each other. The pH of the nickel solution for forming a film is in the range of 4.2 to 6.1. The nickel solution for forming a film further contains a pH buffer solution that has a buffer
(Continued)

function in the range of the pH and does not form insoluble salts or complexes with the nickel ions during formation of the film.

8 Claims, 7 Drawing Sheets

(51) Int. Cl.
    *C25D 7/12* (2006.01)
    *H01L 21/288* (2006.01)
    *C25D 3/00* (2006.01)
    *C25D 17/00* (2006.01)

(52) U.S. Cl.
    CPC ........ H01L 21/2885 (2013.01); *C25D 17/002* (2013.01)

(58) Field of Classification Search
    USPC .................................................. 205/255, 271
    See application file for complete search history.

(56) References Cited

U.S. PATENT DOCUMENTS

| | | | | | |
|---|---|---|---|---|---|
| 3,444,056 | A | * | 5/1969 | Erdmann | C07D 213/71 205/273 |
| 5,985,124 | A | * | 11/1999 | Yoda | C23C 2/02 205/118 |
| 6,143,155 | A | * | 11/2000 | Adams | C25D 5/04 205/123 |
| 6,375,823 | B1 | * | 4/2002 | Matsuda | C25D 5/02 205/117 |
| 6,413,653 | B1 | * | 7/2002 | Araki | C23C 28/322 428/627 |
| 6,447,665 | B1 | * | 9/2002 | Johnson | C25D 11/18 148/272 |
| 2006/0096868 | A1 | | 5/2006 | Bunce et al. | |
| 2008/0217182 | A1 | * | 9/2008 | Dai | C25D 5/02 205/93 |
| 2010/0326713 | A1 | * | 12/2010 | Barthelmes | C23C 18/44 174/257 |
| 2011/0132766 | A1 | | 6/2011 | Middeke | |
| 2014/0224662 | A1 | * | 8/2014 | Arumugam | C25D 5/06 205/93 |
| 2015/0014178 | A1 | * | 1/2015 | Hiraoka | C25D 5/08 204/263 |

FOREIGN PATENT DOCUMENTS

| | | | | |
|---|---|---|---|---|
| GB | 996793 | | 6/1965 | |
| JP | 2002-194600 | A | 7/2002 | |
| JP | 2010-37622 | A | 2/2010 | |
| JP | 2012-162786 | A | 8/2012 | |
| JP | 2012-219362 | A | 11/2012 | |
| JP | 2012219362 | A * | 11/2012 | ............... C25D 5/00 |
| WO | WO-2013125643 | A1 * | 8/2013 | ............... C25D 5/08 |

OTHER PUBLICATIONS

Grin et al., "Study of Solubility of Nickel Acetate in Acidic and Alkaline Media," Visnik Natsional'nogo Tekhnichnogo Universitetu "KhPI" (no month, 2006), vol. 43, pp. 76-82. Abstract only. (Year: 2006).*

Watanabe et al., "Investigation for Substitution Agents of Boric Acid in Nickel Sulfamate Bath," Hyomen Gijutsu (2007), vol. 58, No. 5, pp. 317-324. Abstract Only. (Year: 2007).*

Kensuke Akamatsu et al., "Fabrication of Silver Patterns on Polyimide Films Based on Solid-Phase Electrochemical Constructive Lithography Using Ion-Exchangeable Precursor Layers", Langmuir, 2011, pp. 11761-11766, vol. 27, No. 19.

* cited by examiner

NICKEL SOLUTION FOR FORMING FILM AND FILM-FORMING METHOD USING SAME

CROSS REFERENCE TO RELATED APPLICATIONS

This application is a National Stage of International Application No. PCT/JP2014/076378 filed Oct. 2, 2014, claiming priority based on Japanese Patent Application Nos. 2013-208418 filed Oct. 3, 2013 and 2014-148882 filed Jul. 22, 2014, the contents of all of which are incorporated herein by reference in their entirety.

TECHNICAL FIELD

The present invention relates to a nickel solution for forming a nickel film and a film-forming method using the same. In particular, the present invention relates to a nickel solution for forming a film that can be favorably used for forming a nickel film on the surface of a substrate by bringing a solid electrolyte membrane into contact with the substrate, and a film-forming method using the same.

BACKGROUND ART

Conventionally, when an electronic circuit board or the like is produced, a nickel film is formed on the surface of a substrate to form a nickel circuit pattern thereon. For example, as a film-forming technology for forming such a metal film, there has been proposed a film-forming technology that includes forming a metal film on the surface of a Si semiconductor substrate or the like through a plating process such as an electroless plating process (for example, see Patent Literature 1), or forming a metal film using PVD such as sputtering.

However, when a plating process such as an electroless plating process is performed, it has been necessary to perform water washing after the plating process, as well as processing of a waste liquid that has been produced during the water washing. Meanwhile, when a film is formed on the surface of a substrate using PVD such as sputtering, internal stress is generated in the metal film formed. Thus, there is a limitation in increasing the thickness of the film. In particular, when sputtering is performed, a film may be formed only in a high vacuum in some cases.

In view of the foregoing, there has been proposed a film-forming method for forming a metal film that uses an anode, a cathode, a solid electrolyte membrane disposed between the anode and the cathode, and a power supply unit that applies a voltage across the anode and the cathode (for example, see Patent Literature 2).

The solid electrolyte membrane herein is formed by spin-coating the surface of a substrate with a solution containing a precursor of the solid electrolyte membrane in advance and curing it. The solid electrolyte membrane is impregnated with metal ions for forming a film. Then, a substrate is disposed such that it is opposite the anode and is electrically connected to the cathode, and a voltage is applied across the anode and the cathode so that the metal ions that have impregnated the solid electrolyte membrane are deposited on the cathode side. Accordingly, a metal film made of metal of the metal ions can be formed.

CITATION LIST

Patent Literature

Patent Literature 1: JP 2010-037622 A
Patent Literature 2: JP 2012-219362 A

SUMMARY OF INVENTION

Technical Problem

However, when the technology described in Patent Literature 2 is used, it is necessary to produce a solid electrolyte membrane each time a film is formed, and further, if a metal solution that contains nickel ions dissolved therein as metal ions is used, there is a possibility that hydrogen gas may be generated between the solid electrolyte membrane and the substrate. Such hydrogen gas is likely to be generated as the formation of a film proceeds, and thus, there is a possibility that the generated hydrogen gas may accumulate between the solid electrolyte membrane and the substrate, which in turn may disturb the contact between the solid electrolyte membrane and the substrate. Accordingly, non-deposited portions may be formed in the resulting nickel film, or burning (i.e., a phenomenon that metallic oxide, hydroxide, or the like is generated in the nickel film, thus causing discoloration) may be generated.

The present invention has been made in view of the foregoing, and it is an object of the present invention to provide a nickel solution for forming a nickel film and a film-forming method using the same that can suppress generation of hydrogen gas between a solid electrolyte membrane and a substrate while the solid electrolyte membrane and the substrate are brought into contact with each other.

Solution to Problem

In view of the foregoing, the inventors, as a result of conducting concentrated studies, considered that hydrogen gas is likely to be generated between a solid electrolyte membrane and a substrate during formation of a film as the standard electrode potential of nickel is lower than that of hydrogen. Then, the inventors obtained a new finding that if the pH of a nickel solution for forming a film satisfies a predetermined range and the range is maintained, it is possible to preferentially deposit nickel rather than generation of hydrogen gas, and thus suppress generation of hydrogen gas even when a film is formed.

The present invention is based on such new finding of the inventors. A nickel solution for forming a film in accordance with the present invention is a nickel solution adapted to, when disposing a solid electrolyte membrane between an anode and a substrate that functions as a cathode, bringing the solid electrolyte membrane into contact with the substrate and applying a voltage across the anode and the substrate so as to deposit nickel onto a surface of the substrate from nickel ions contained in the solid electrolyte membrane, thereby forming a nickel film containing the nickel on the surface of the substrate, supply the nickel ions to the solid electrolyte membrane. The nickel solution for forming a film contains nickel ions as the nickel ions, and has a pH in the range of 4.2 to 6.1. The nickel solution for forming a film further contains a pH buffer solution, the pH buffer solution having a buffer function in the aforementioned range of the pH and not forming insoluble salts or complexes with the nickel ions during formation of a film.

According to the present invention, the solid electrolyte membrane is brought into contact with the substrate in a state in which the solid electrolyte membrane is disposed between the anode and the cathode during formation of a film. In such a state, a voltage is applied across the anode and the substrate that functions as the cathode, so that nickel can be deposited onto the surface of the substrate from nickel ions contained in the solid electrolyte membrane. Consequently, a nickel film containing nickel of the nickel ions can be formed on the surface of the substrate.

At this time, as the pH of the nickel solution for forming a film is in the range of 4.2 to 6.1, it is possible to, during formation of a film, preferentially deposit nickel by suppressing generation of hydrogen gas prior to deposition of nickel in the range of the pH. Further, even when the pH of the nickel solution for forming a film has changed during formation of a film, the pH of the nickel solution for forming a film is maintained in the aforementioned range by the pH buffer solution during formation of the film. Therefore, it is possible to obtain a uniform, homogeneous nickel film by preferentially depositing nickel onto the substrate while suppressing generation of hydrogen gas during formation of the film.

Herein, the pH buffer solution having a buffer function in the aforementioned range of the pH during formation of a film means a pH buffer solution (i.e., buffer liquid) that has a function of adjusting the pH of the nickel solution for forming a film to be within the aforementioned range prior to formation of a film, and maintaining, even when the pH has thereafter changed during formation of the film, the pH of the nickel solution for forming a film within the aforementioned range of the pH.

In addition, as the pH buffer solution does not form insoluble salts or complexes with the nickel ions, it is possible to favorably deposit nickel between the solid electrolyte membrane and the substrate by passing the nickel ions through the solid electrolyte membrane. A pH buffer solution that does not form insoluble salts or complexes with nickel ions means a pH buffer solution that does not form insoluble salts or complexes with nickel ions in the nickel solution for forming a film, that is, a pH buffer solution that can retain nickel ions in a state of being able to be deposited, in the nickel solution for forming a film.

As such a pH buffer solution, an inorganic acid buffer solution, a monocarbonic acid buffer solution, a dicarboxylic acid buffer solution, a tricarboxylic acid buffer solution, or the like can be used. More preferably, the pH buffer solution is an acetic acid-acetate buffer solution or a succinic acid-succinate buffer solution. According to the present invention, such a pH buffer solution favorably suppresses generation of hydrogen gas during formation of a film as is obvious from the experiments conducted by the inventors described below.

More preferably, cations that are contained in the pH buffer solution are nickel ions or ions of metal with lower ionization tendency than nickel.

According to such an embodiment, if cations that are contained in the pH buffer solution are nickel ions, it is possible to allow nickel ions in a plating solution and the nickel ions contained in the pH buffer solution to easily move from the anode side in the solid electrolyte membrane to the cathode side. That is, there is no possibility that the cations contained in the pH buffer solution will disturb the movement of nickel ions in the solid electrolyte membrane.

Meanwhile, if cations that are contained in the pH buffer solution are ions of metal with lower ionization tendency than nickel, the cations contained in the pH buffer solution move with nickel ions in a plating solution for forming a film upon application of a voltage across the anode and the substrate. Therefore, there is no possibility that the cations will disturb the movement of nickel ions from the anode side in the solid electrolyte membrane to the cathode side.

Accordingly, it is possible to obtain a uniform, homogeneous nickel film by increasing the film-forming speed and suppressing generation of hydrogen gas on the substrate side as described above. Further, as other metal ions are not used for the cations, there is no possibility that the film fill contain impurities that are derived from such metal ions.

Herein, if cations that are contained in the pH buffer solution are ions of metal with higher ionization tendency than nickel, the cations will remain in the solid electrolyte membrane during formation of a film, and thus will disturb the movement of nickel ions from the anode side in the solid electrolyte membrane to the cathode side. Therefore, there is a possibility that the film-forming speed may decrease. Meanwhile, if the current density is increased to increase the film-forming speed, hydrogen gas will be more likely to be generated on the cathode side of the solid electrolyte membrane. Thus, defects will be more likely to be generated in the resulting nickel film.

From such a point, the pH buffer solution preferably contains no sodium ions or potassium ions. According to such an embodiment, as the pH buffer solution does not contain such ions, movement of nickel ions from the anode side in the solid electrolyte membrane to the cathode side is hardly disturbed.

More preferably, the pH buffer solution is an acetic acid-nickel acetate buffer solution or a succinic acid-nickel succinate buffer solution. According to such an embodiment, cations that are contained in the pH buffer solution are nickel ions. Thus, it is possible to obtain a uniform, homogeneous, high-purity nickel film by increasing the film-forming speed while suppressing generation of hydrogen gas on the substrate side. In addition, as the pH buffer solution is an acetic acid-acetate buffer solution or a succinic acid-succinate buffer solution, it is possible to favorably suppress generation of hydrogen gas during formation of a film as compared to when other pH buffer solutions are used.

A method for forming a nickel film using the aforementioned nickel solution for forming a film is disclosed below. The method for forming a nickel film includes disposing a solid electrolyte membrane between an anode and a substrate that functions as a cathode, bringing the solid electrolyte membrane into contact with the substrate and applying a voltage across the anode and the substrate so as to deposit nickel onto a surface of the substrate from nickel ions contained in the solid electrolyte membrane, thereby forming a nickel film containing the nickel on the surface of the substrate.

At this time, the nickel solution for forming a film is brought into contact with the solid electrolyte membrane, so that a voltage is applied across the anode and the substrate while the nickel ions are supplied to the solid electrolyte membrane. Thus, the nickel film is formed on the surface of the substrate.

According to such an embodiment, it is possible to deposit nickel from nickel ions while the solid electrolyte membrane and the substrate are brought into contact with each other, and thus form a nickel film while suppressing generation of hydrogen gas that is a peculiar problem associated with the formation of a nickel film.

Advantageous Effects of Invention

According to the present invention, it is possible to suppress generation of hydrogen gas between a solid electrolyte membrane and a substrate while the solid electrolyte membrane and the substrate are brought into contact with each other, and thus suppress generation of non-deposited portions (pinholes) and generation of burns in the resulting film. Thus, a uniform, homogeneous nickel film can be formed.

DESCRIPTION OF EMBODIMENTS

Hereinafter, a film-forming apparatus that can favorably perform a film-forming method for forming a nickel film in accordance with an embodiment of the present invention will be described.

Figure 1:
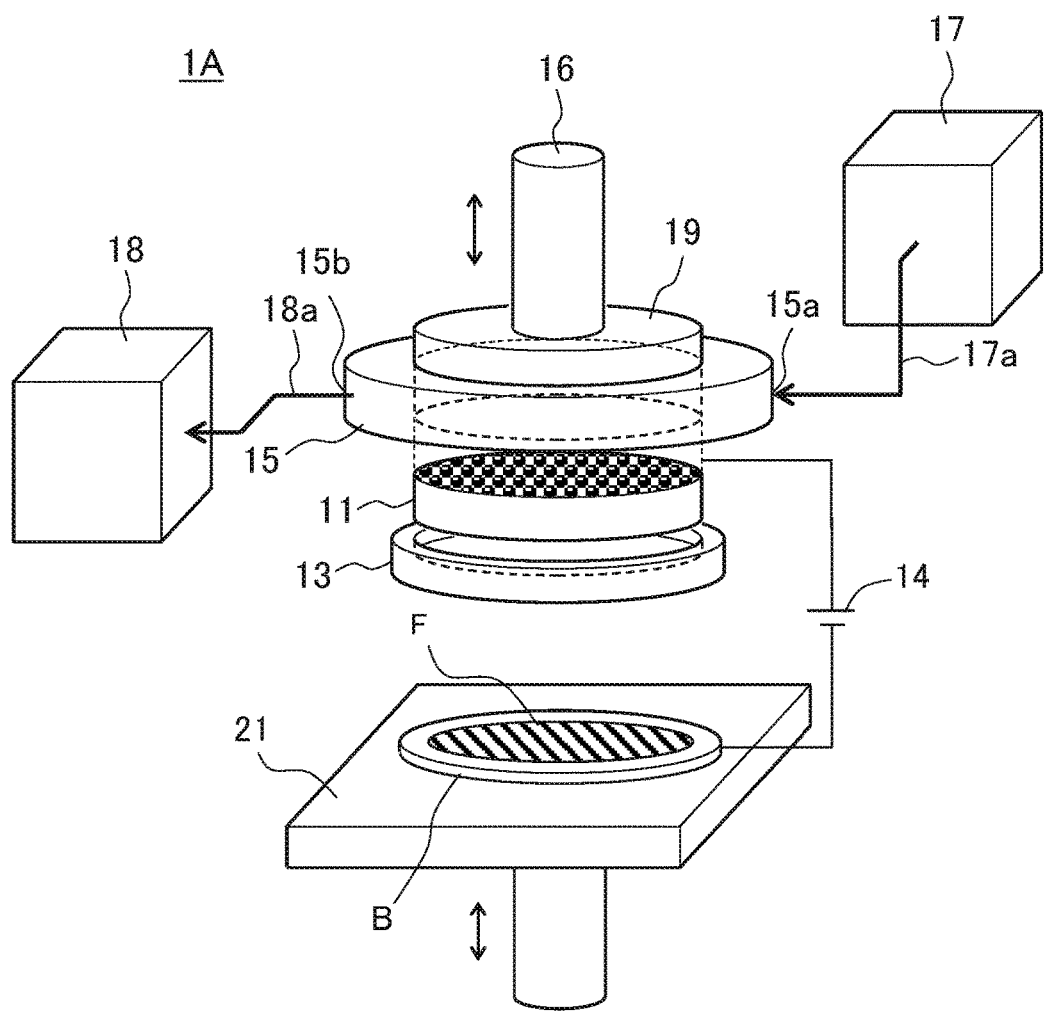
FIG. 1 is a schematic conceptual view of a film-forming apparatus for forming a nickel film in accordance with the present embodiment of the present invention.
Figure 2:
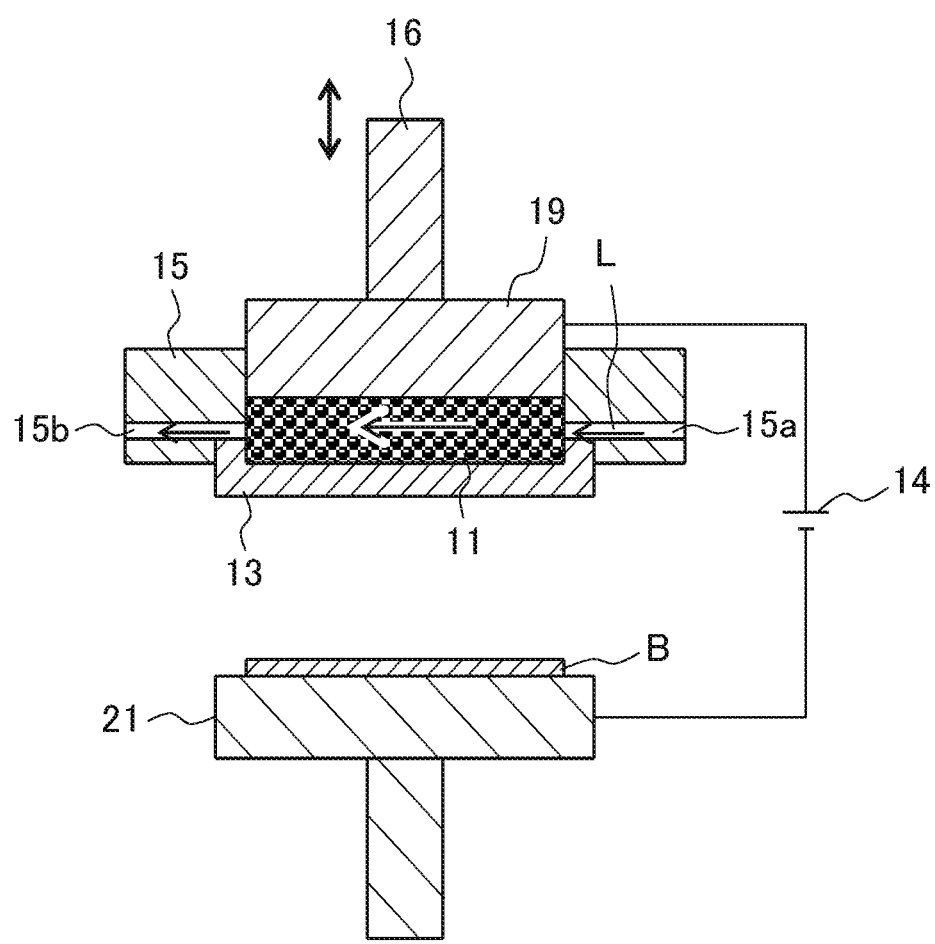
FIG. 2 is a schematic cross-sectional view illustrating a film-forming method performed by the film-forming apparatus for forming a nickel film shown in FIG. 1.

FIG. 1 is a schematic conceptual view of a film-forming apparatus 1A for forming a nickel film F in accordance with the present embodiment of the present invention. FIG. 2 is a schematic cross-sectional view illustrating a film-forming method performed by the film-forming apparatus 1A for forming the nickel film F shown in FIG. 1.

As shown in FIG. 1, the film-forming apparatus 1A in accordance with the present invention is an apparatus for depositing nickel from nickel ions and thus forming a nickel film F of the deposited nickel on the surface of a substrate B. For the substrate B herein, a substrate made of a metal material such as aluminum, or a substrate, which is obtained by forming a metal base layer on the surface to be processed of a resin or silicon substrate, is used.

The film-forming apparatus 1A at least includes an anode 11 made of metal, a solid electrolyte membrane 13 disposed on the surface of the anode 11, between the anode 11 and the substrate B that functions as a cathode, and a power supply unit 14 that applies a voltage across the anode 11 and the substrate B that functions as the cathode.

The anode 11 is stored in a housing (i.e., nickel ion supply part) 15 that supplies a solution containing nickel ions for forming a film (hereinafter referred to as a "nickel solution") L to the anode 11. The housing 15 has a through portion that passes through the housing 15 in the vertical direction thereof, and stores the anode 11 in the internal space thereof. The solid electrolyte membrane 13 has a recess formed therein so as to cover the lower surface of the anode 11. The solid electrolyte membrane 13 covers an opening on the bottom side of the through portion of the housing 15 while storing the bottom portion of the anode 11.

Further, a contact pressurization part (i.e., metal punch) 19, which is in contact with the upper surface of the anode 11 and is adapted to press the anode 11, is disposed in the through portion of the housing 15. The contact pressurization part 19 is adapted to press the surface of the substrate B using the solid electrolyte membrane 13 via the anode 11. Specifically, the contact pressurization part 19 presses the surface of the anode 11 corresponding to a film-forming region on which the nickel film F is to be formed of the surface of the substrate B so as to uniformly press the film-forming region.

In the present embodiment, the lower surface of the anode 11 has a size corresponding to the film-forming region of the substrate B, and the upper surface and the lower surface of the anode 11 have the same size. Thus, when the upper surface (i.e., whole surface) of the anode 11 is pressed by the contact pressurization part 19 with a thrust of pressurization means 16 described below, the film-forming region (i.e., the whole region) of the substrate B can be uniformly pressed by the lower surface (i.e., whole surface) of the anode 11 via the solid electrolyte membrane 13.

Further, a solution tank 17, which stores a nickel solution L, is connected to one side of the housing 15 via a supply pipe 17a, while a waste liquid tank 18, which collects a waste liquid after use, is connected to the other side of the housing 15 via a waste liquid pipe 18a.

Herein, the supply pipe 17a is connected to a supply flow path 15a for the nickel solution L in the housing 15, while the waste liquid pipe 18a is connected to a discharge flow path 15b for the nickel solution L in the housing 15. As shown in FIG. 2, the anode 11, which is made of a porous body, is disposed in a flow path that connects the supply flow path 15a and the discharge flow path 15b of the housing 15.

According to such a configuration, the nickel solution L stored in the solution tank 17 is supplied to the inside of the housing 15 via the supply pipe 17a. In the housing 15, the nickel solution L passes through the supply flow path 15a, and flows into the anode 11 from the supply flow path 15a. The nickel solution L that has passed through the anode 11 flows through the discharge flow path 15b, and thus can be transferred to the waste liquid tank 18 via the waste liquid pipe 18a.

Further, the pressurization means 16 is connected to the contact pressurization part 19. The pressurization means 16 is adapted to press the solid electrolyte membrane 13 against a film-forming region E of the substrate B by moving the anode 11 toward the substrate B. As the pressurization means 16, a hydraulic or pneumatic cylinder can be used, for example. The film-forming apparatus 1A also includes a base 21 for fixing the substrate B and adjusting the alignment of the substrate B relative to the anode 11.

The anode 11 is made of a porous body that passes the nickel solution L therethrough and thus supplies nickel ions to the solid electrolyte membrane. Such a porous body is not particularly limited as long as (1) it has corrosion resistance to the nickel solution L, (2) has conductivity operable as an anode, (3) can pass the nickel solution L therethrough, and (4) can be pressed by the pressurization means 16 via the contact pressurization part 19 described below. However, foam metal made of a material with a low oxygen overvoltage, such as platinum or iridium oxide, or a material obtained by covering highly corrosion-resistant foam metal, such as titanium, with platinum, iridium oxide, or the like is preferably used.

The size of the porous body is not particularly limited as long as the condition (3) described above is satisfied. When a foam metal body is used, it preferably has a porosity of about 50 to 95 volume %, a pore diameter of about 50 to 600 μm, and a thickness of about 0.1 to 50 mm.

As the nickel solution L, a solution containing nickel sulfate, nickel pyrophosphate, or the like can be used, for example. In addition, as the solid electrolyte membrane 13, a membrane made of a solid electrolyte, a film, or the like can be used.

The material of the solid electrolyte membrane 13 is not particularly limited as long as the solid electrolyte membrane 13 can be impregnated with nickel ions by being brought into contact with the nickel solution L described above, and nickel derived from the nickel ions can be deposited onto the surface of the substrate B upon application of a voltage. As the material of the solid electrolyte membrane, fluorine-based resin, such as Nafion (registered trademark) of DuPont, hydrocarbon-based resin, polyamic acid resin, resin with an ion exchange function, such as Selemion (i.e., CMV, CMD, and CMF series) of ASAHI GLASS CO., LTD., can be used, for example.

Herein, although the anode 11 in the present embodiment is a porous body as an apparatus for forming the nickel film F, the present invention is not limited to such an apparatus or a film-forming method that uses such an apparatus as long as the solid electrolyte membrane 13 can be impregnated with nickel ions.

A method for forming a nickel film using such a film-forming apparatus 1A is described below. First, as shown in FIGS. 1 and 2, the substrate B is disposed on the base 21, and the alignment of the substrate B relative to the anode 11 as well as the temperature of the substrate B is adjusted. Next, the solid electrolyte membrane 13 is disposed on the surface of the anode 11 made of a porous body, and the solid electrolyte membrane 13 is brought into contact with the substrate B.

Next, the anode 11 is moved toward the substrate B using the pressurization means 16, whereby the solid electrolyte membrane 13 is pressed against the film-forming region of the substrate B. Accordingly, as the solid electrolyte membrane 13 can be pressed via the anode 11, the solid electrolyte membrane 13 can be uniformly placed along the surface of the substrate B in the film-forming region. That is, the nickel film F with a more uniform thickness can be formed while the solid electrolyte membrane 13 is brought into contact with (pressed against) the substrate using the anode 11, which is pressed by the contact pressurization part 19, as a backup material.

Next, with the above contact state maintained, a voltage is applied across the anode 11 and the substrate B that functions as the cathode, using the power supply unit 14, so that nickel is deposited onto the surface of the substrate B from the nickel ions contained in the solid electrolyte membrane 13. As the anode 11 is in direct contact with the contact pressurization part 19 made of metal, the anode is electrically connected to the contact pressurization part 19. Thus, a voltage can be applied across the anode 11 and the substrate B by the power supply unit 14.

At this time, a nickel film is formed while the nickel solution L is flowed to the inside of the anode 11. Consequently, using the anode 11 made of a porous body allows the nickel solution L to pass through the inside thereof and thus allows the nickel solution L to be supplied to the solid electrolyte membrane 13 together with nickel ions. Accordingly, the nickel solution L can be stably supplied to the inside of the anode 11 made of a porous body at any time during formation of a film. The thus supplied nickel solution L passes through the inside of the anode 11, and comes into contact with the solid electrolyte membrane 13 adjacent to the anode 11, so that the solid electrolyte membrane 13 is impregnated with nickel ions.

Then, a voltage is applied across the anode 11 and the substrate B that functions as the cathode, so that the nickel ions in the solid electrolyte membrane 13 move toward the substrate B side from the anode 11 side, thus allowing nickel to be deposited onto the surface of the substrate B from the nickel ions contained in the solid electrolyte membrane 13. Accordingly, the nickel film F can be formed on the surface of the substrate B.

Accordingly, as the film-forming region of the substrate B can be uniformly pressed with the solid electrolyte membrane 13, a nickel film can be formed on the substrate while the solid electrolyte membrane 13 is uniformly placed along the film-forming region of the substrate B. Consequently, a homogeneous nickel film with small variations and uniform thickness can be formed on the surface of the film-forming region of the substrate.

Figure 7A:
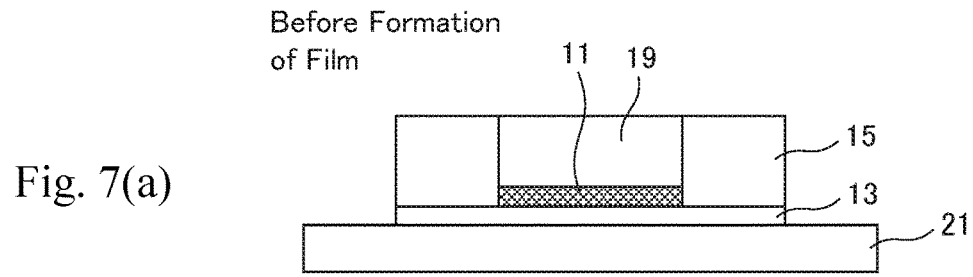
FIGS. 7(a), 7(b), 7(c), and 7(d) are views illustrating problems that occur when a film is formed using a film-forming apparatus that uses a solid electrolyte membrane.
Figure 7B:
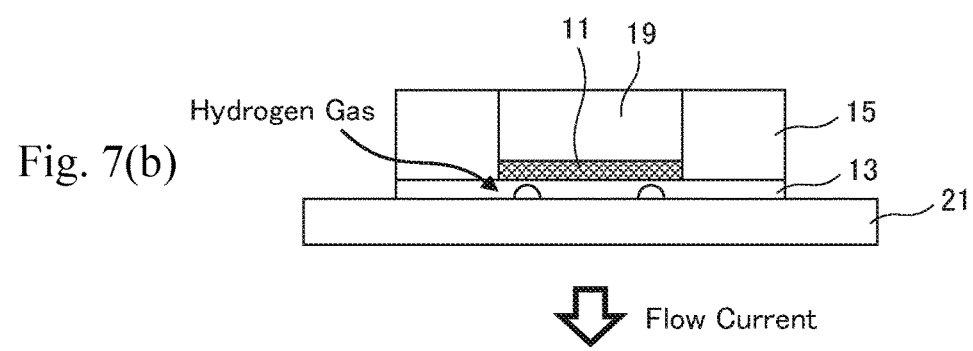

Herein, when the formation of the nickel film F is continued in the state of FIG. 7(a), hydrogen may be preferentially generated between the solid electrolyte membrane 13 and the substrate B as shown in FIG. 7(b) as the standard electrode potential of nickel is lower than that of hydrogen.

Figure 7C:
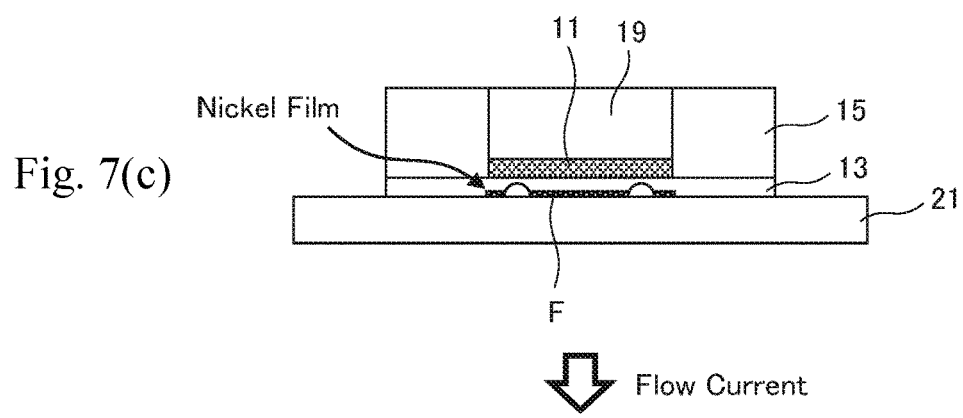
Figure 7D:
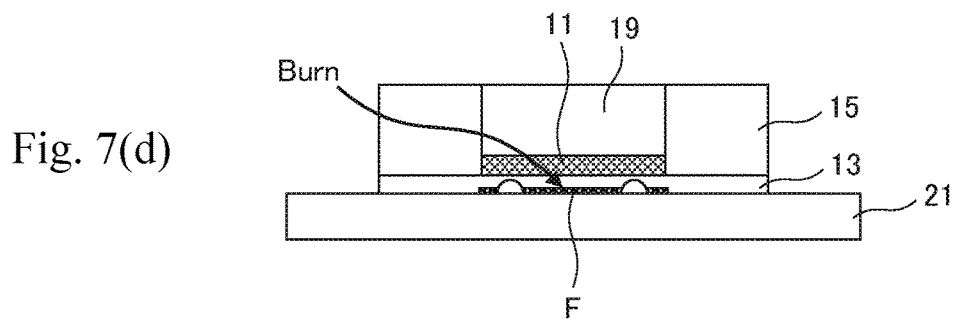

Hydrogen gas generated between the solid electrolyte membrane 13 and the substrate B accumulates between them as shown in FIG. 7(c). In the portion in which hydrogen gas has accumulated, nickel cannot be deposited as the contact between the solid electrolyte membrane 13 and the substrate B is disturbed. Consequently, the deposited area of nickel decreases due to the accumulated gas as shown in FIG. 7(d), and an excessive amount of current flows, and further, electricity is likely to concentrate at the interface between a deposited portion and a non-deposited portion (i.e., pinhole generated portion). Due to such complex factors, burning may occur.

By the way, when the nickel film F is formed using the conventional common wet plating, hydrogen gas may also be generated. However, as a plating solution is agitated during formation of the film, the generated hydrogen gas will be easily diffused through the liquid from the substrate by the agitation. Thus, there is no possibility that the hydrogen gas will have adverse effects. However, as described above, if a solid electrolyte membrane is brought into surface-contact with the surface of the substrate as in the present embodiment, there is a possibility that pinholes and burns may be generated in the nickel film as the generated hydrogen gas will not entirely escape from the space between the solid electrolyte membrane and the substrate.

Figure 3:
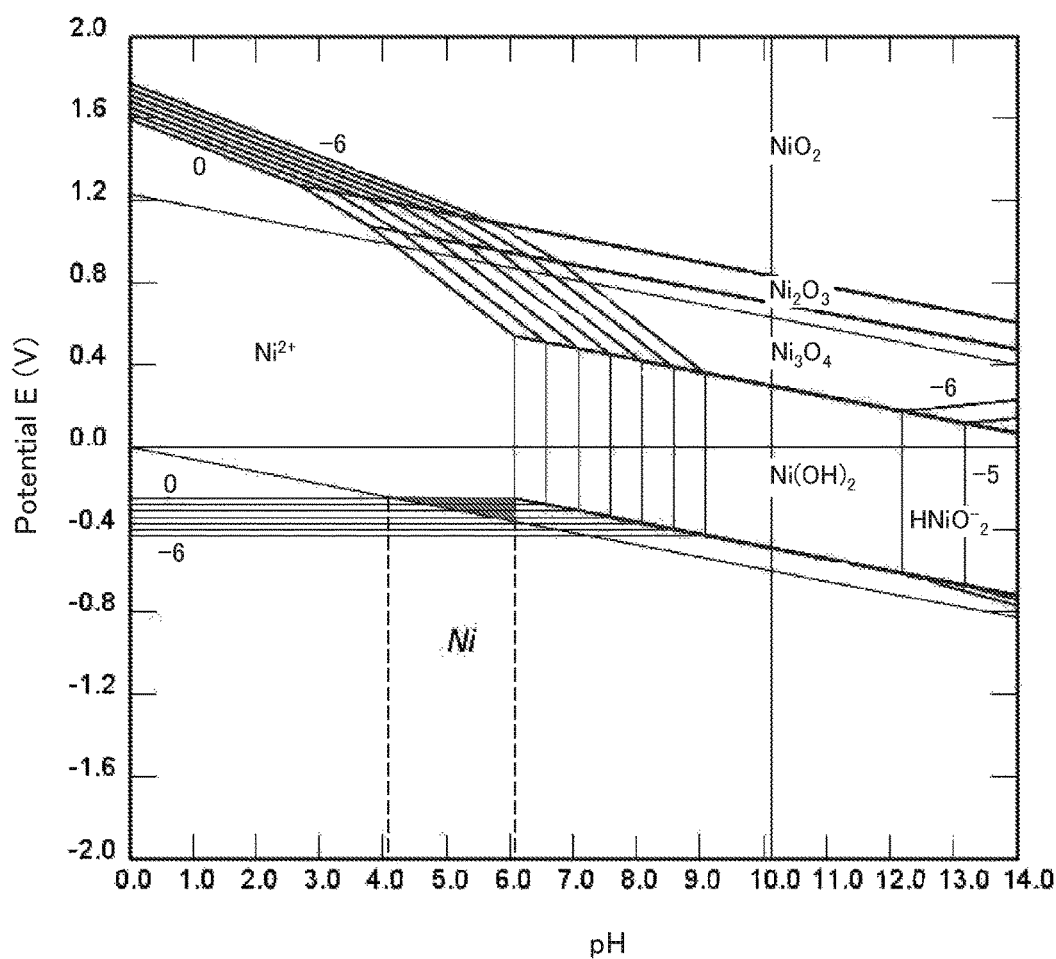
FIG. 3 is a pH-potential chart of $Ni-H_2O$.
Figure 4:
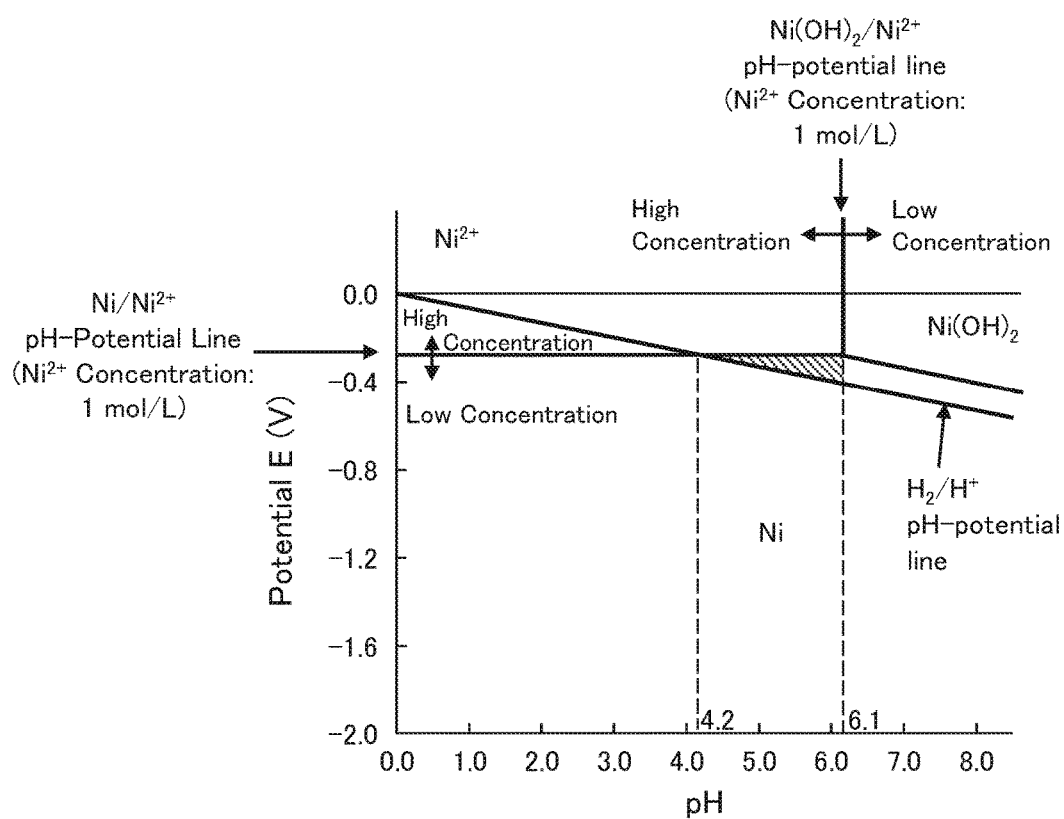
FIG. 4 is a pH-potential chart of $Ni-H_2O$ at 1.0 mol/L in accordance with the present embodiment of the pH-potential chart shown in FIG. 3.

Thus, in the present embodiment, in order to suppress generation of hydrogen gas during formation of a film, the pH and the potential of the nickel solution are focused. FIG. 3 is a pH-potential chart of Ni—$H_2O$. FIG. 4 is a pH-potential chart of Ni—$H_2O$ at 1.0 mol/L in accordance with the present embodiment of the pH-potential chart shown in FIG. 3.

As shown in FIG. 3, the deposition state of nickel changes depending on the pH of the nickel solution and the potential acting thereon. In particular, as shown in FIG. 4, the range in which nickel is preferentially deposited rather than generation of hydrogen gas is the range surrounded by a Ni/$Ni^{2-}$ pH-potential line, a $Ni(OH)_2/Ni^{2+}$ pH-potential line, and a $H_2/H^+$ pH-potential line (i.e., a portion of an upside-down triangle shown in FIGS. 3 and 4). The pH of the nickel solution in this range is 4.2 to 6.1. When the pH of the nickel solution L is maintained within such a pH range during formation of a film, it is possible to favorably deposit nickel while suppressing generation of hydrogen gas.

Herein, if the pH of the nickel solution L is less than 4.2, there is a possibility that hydrogen gas may be generated, and it becomes difficult to deposit Ni. Meanwhile, if the pH is over 6.1, the nickel ion concentration in the nickel solution decreases. Thus, there is a possibility that unevenly deposited portions may be generated, and further, nickel hydroxide may be generated.

When a nickel film is formed by depositing nickel ions using a solid electrolyte membrane, the $Ni/Ni^{2+}$ pH-potential line and the $Ni(OH)_2/Ni^{2+}$ pH-potential line shown in FIG. 3 will hardly change in terms of the nickel ion concentration and a change in the concentration. Thus, as long as the pH of the nickel solution is in the range of 4.2 to 6.1 described above, nickel will be preferentially deposited rather than generation of hydrogen gas.

Herein, first, in order to adjust the pH of the nickel solution L to 4.2 to 6.1, a pH adjustor may be added to the nickel solution L in advance. As the pH adjustor, bases or acids are selected as appropriate, and are added as the pH adjustor. Preferably, a pH adjustor that contains nickel or protons as cations is used. Examples of bases include basic nickel carbonate, and examples of acids include sulfuric acid.

It should be noted that a reaction of $2H_2O \rightarrow O_2+4H^++4e^-$ occurs on the anode side in which the nickel solution L is present, and the pH decreases with an increase of hydrogen ions in the nickel solution. Thus, the pH of the nickel solution is preferably in the range of 5.5 to 6.1 from before formation of a film in order to be within the aforementioned pH range.

Further, in order to maintain the pH of the nickel solution L within the range of 4.2 to 6.1, the nickel solution L is made to further contain a pH buffer solution (i.e., pH buffer liquid) that has a buffer function in the pH range and does not form insoluble salts or complexes with nickel ions during formation of a film.

Specifically, when the formation of a film is continued, the pH of the nickel solution will decrease along with the deposition of nickel. Therefore, a pH buffer solution, which can maintain the pH of the nickel solution within the range of 4.2 to 6.1 even when nickel ions in the nickel solution has decreased during formation of a film, is added.

Specific examples of such a buffer solution include (1) an inorganic acid buffer solution such as a phosphoric acid-nickel phosphate buffer solution, (2) a monocarboxylic acid buffer solution such as an acetic acid-nickel acetate buffer solution or an acetic acid-sodium acetate buffer solution, (3) a dicarboxylic acid buffer solution such as succinic acid-nickel succinate or oxalic acid-nickel oxalate, (4) a tricarboxylic acid buffer solution such as citric acid-nickel citrate, and (5) aminocarboxylic acid. Using such a buffer solution can maintain the pH of the nickel solution within the range of 4.2 to 6.1 and will not form insoluble salts or complexes with nickel ions during formation of a film. The concentration of the buffer solution is preferably 0.1 to 2 mol/L, or more preferably, 0.4 to 0.6 mol/L. If the buffer solution contains cations that are different from nickel ions, the concentration of the buffer solution is preferably adjusted to be lower than that of nickel ions.

Although the pH of the nickel solution will decrease along with the deposition of nickel as described above, if the decrease in the pH is suppressed by using a buffer solution, it becomes possible to have the pH of the nickel solution in the aforementioned pH range and maintain the pH range. Accordingly, it is possible to suppress generation of hydrogen gas between the solid electrolyte membrane and the substrate during formation of a film, and thus continuously form a film.

As a nickel compound added to and dissolved in the nickel solution, halides, such as chloride or bromide, inorganic salts, such as sulfate or nitrate, or organic acid salts, such as acetate or citrate, can be used alone or two or more of them may be used in combination. The nickel ion concentration is not particularly specified, but if the nickel ion concentration is 0.1 to 2 mol/L, or more preferably, 0.8 to 1.2 mol/L, an excellent nickel film is formed.

By the way, during formation of a nickel film, nickel ions move from the anode side in the solid electrolyte membrane to the cathode side while an anionic functional group (i.e., sulfonic group) in the solid electrolyte membrane repeats desorption-coordination (adsorption). Herein, if ions of metal with higher ionization tendency than nickel are present on the movement path of nickel ions from the anode side in the solid electrolyte membrane to the cathode side during formation of a film, movement of the nickel ions in the solid electrolyte membrane may be disturbed, which can result in decreased film-formation efficiency.

In view of the foregoing, cations that are contained in the pH buffer solution are preferably nickel ions or ions of metal with lower ionization tendency than nickel.

Herein, if cations that are contained in the pH buffer solution are nickel ions, the nickel ions are present on the movement path of nickel ions from the anode side in the solid electrolyte membrane to the cathode side. Therefore, there is no possibility that the movement of the nickel ions in the solid electrolyte membrane will be disturbed.

Meanwhile, if cations that are contained in the pH buffer solution are ions of metal with lower ionization tendency than nickel, the cations in the solid electrolyte membrane also move together with nickel. Therefore, there is no possibility that the cations will disturb the movement of nickel ions from the anode side in the solid electrolyte membrane to the cathode side.

Consequently, it is possible to obtain a uniform, homogeneous nickel film by increasing the film-forming speed of the nickel film while suppressing generation of hydrogen gas on the substrate side in any case. In particular, if cations that are contained in the pH buffer solution are nickel ions, a nickel film containing few impurities can be formed.

Meanwhile, if cations that are contained in the pH buffer solution are ions of metal with higher ionization tendency than nickel, nickel and cations of metal with high ionization tendency (i.e., sodium or potassium) are present in the solid electrolyte membrane. In the solid electrolyte membrane, nickel ions are consumed through deposition while moving through the solid electrolyte membrane, whereas cations of metal with higher ionization tendency than nickel remain in the solid electrolyte membrane.

Consequently, the cations are present on the movement path of the nickel ions. If the current density is increased to increase the film-forming speed, hydrogen gas is likely to be generated on the cathode side of the solid electrolyte membrane, and thus, defects are likely to be generated in the nickel film.

In particular, although a pH buffer solution typically contains sodium ions or potassium ions as cations, the ionization tendency of metal (i.e., sodium or potassium) of such cations is higher than that of nickel. Thus, the pH buffer solution desirably contains no sodium ions or potassium ions.

If the pH buffer solution is an acetic acid-nickel acetate buffer solution or a succinic acid-nickel succinate buffer solution, cations that are contained in the pH buffer solution are nickel ions. Thus, it is possible to obtain a uniform, homogeneous, high-purity nickel film by increasing the film-forming speed while suppressing generation of hydrogen gas on the substrate side. Further, as the pH buffer solution is an acetic acid-acetate buffer solution or a succinic acid-succinate buffer solution, it is possible to favorably suppress generation of hydrogen gas during formation of a film as compared to when other pH buffer solutions are used.

EXAMPLES

The present invention will be described in accordance with the following examples.

Example 1

<Production of Nickel Solution>

A 24.9 ml acetic acid-sodium acetate buffer solution with a concentration of 2.0 mol/L was poured into a 58.4 mL nickel sulfate ion aqueous solution with a concentration of 1.71 mol/L, and the mixture was agitated. Next, 15.3 mL water was added to the liquid and agitated. Then, a proper amount of aqueous sodium hydroxide with a concentration of 10 mol/L was dripped in the nickel solution to adjust the pH to 5.6. Further, water was added to the pH-adjusted nickel solution so that a total amount of the solution became 100 mL. Thus, a nickel solution shown in Table 1 was produced.

<Formation of Nickel Film>

Figure 5A:
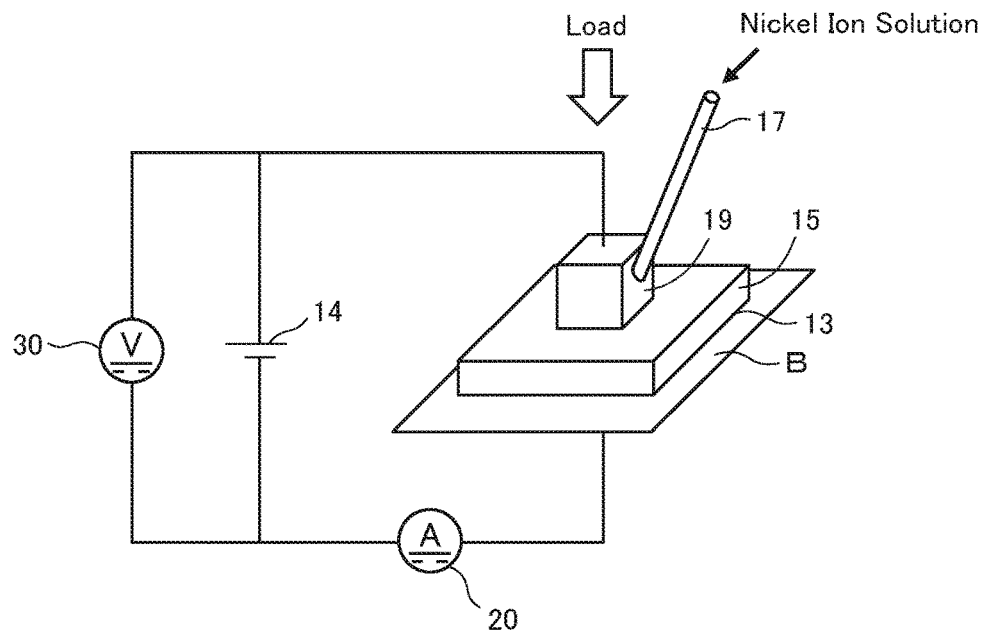
FIG. 5(a) is a schematic perspective view of a film-forming apparatus in accordance with an example.
Figure 5B:
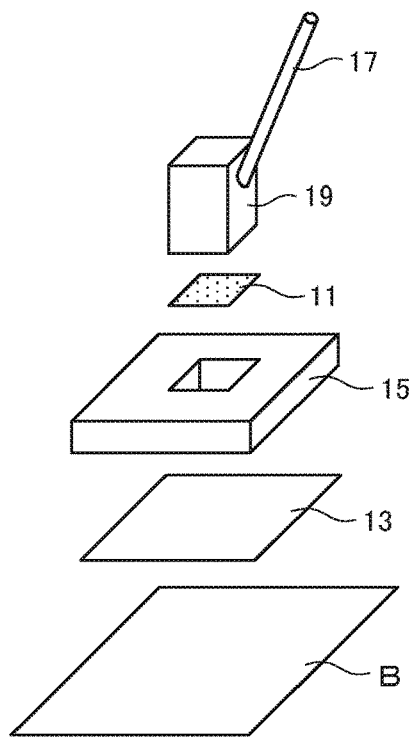
FIG. 5(b) is an exploded perspective view of FIG. 5(a).

A nickel film was formed using a film-forming apparatus shown in FIGS. 5(a) and 5(b). It should be noted that among the members of the film-forming apparatus shown in FIGS. 5(a) and 5(b) and the members of the film-forming apparatus that have been already described with reference to FIGS. 1 and 2, the same reference numerals denote the same function.

First, a pure aluminum substrate (50 mm×50 mm×1 mm in thickness) was prepared as the substrate B on the surface of which a film is to be formed. Then, a nickel plating film was formed on the surface, and a gold plating film was further formed on the surface of the nickel plating film, and then, the film was washed with running pure water.

Next, the anode 11 was used that has been obtained by covering the surface of a porous body, which is made of foamed titanium of 10 mm×10 mm×1 mm and has a porosity of 65 volume % (Mitsubishi Materials Corporation), with platinum plating with a thickness of 3 μm. For the solid electrolyte membrane 13, an electrolyte membrane (a product of DuPont; Nafion N117 (whose anionic functional group is a sulfonic group)) with a thickness of 173 μm was used.

As shown in FIG. 5(b), a glass jig, which is the metal ion supply part 15, the anode 11, the solid electrolyte membrane 13, and the contact pressurization part 19 were set, and a load of 5 kgf/cm$^2$ was applied to the contact pressurization part 19. Next, the anode 11 was filled with a nickel solution from the supply pipe 17a so that nickel ions were supplied to the solid electrolyte membrane 13.

The current density between the anode 11 and the substrate B, which functions as the cathode, was adjusted to 5 mA/cm$^2$ by the power supply unit 14 and such a state was maintained for 10 minutes to form a nickel film while an ammeter 20 and a voltmeter 30 were checked. It should be noted that a nickel solution was supplied once every two minutes in this period.

Comparative Example 1

A nickel film was formed as in Example 1. This example differs from Example 1 in that in the production of a nickel solution, an acetic acid-sodium acetate buffer solution was not added to a 58.4 mL nickel sulfate ion aqueous solution with a concentration of 1.71 mol/L, but 40.2 mL water was added and the mixture was agitated. Then, a proper amount of aqueous sodium hydroxide with a concentration of 10 mol/L was dripped in the nickel solution to adjust the pH to 5.6. Further, water was added to the pH-adjusted nickel solution so that a total amount of the solution became 100 mL.

Example 2

A nickel film was formed as in Example 1. Example 2 differs from Example 1 in that in the production of a nickel solution, a 58.4 mL nickel sulfamate ion aqueous solution with a concentration of 1.71 mol/L was used instead of the 58.4 mL nickel sulfate ion aqueous solution with a concentration of 1.71 mol/L.

Comparative Example 2

A nickel film was formed as in Example 1. This example differs from Example 1 in that in the production of a nickel solution, an acetic acid-sodium acetate buffer solution was not added to a 58.4 mL nickel sulfamate ion aqueous solution with a concentration of 1.71 mol/L. Instead, 40.2 mL water wad added and agitated, and a proper amount of aqueous sodium hydroxide with a concentration of 10 mol/L was dripped in the nickel solution to adjust the pH to 5.6. Further, water was added to the pH-adjusted nickel solution so that a total amount of the solution became 100 mL.

Example 3

A nickel film was formed as in Example 1. This example differs from Example 1 in that in the production of a nickel solution, instead of an acetic acid-sodium acetate buffer solution, a 40.2 ml succinic acid aqueous solution with a concentration of 2.49 mol was poured into a 58.4 mL nickel sulfamate ion aqueous solution with a concentration of 1.71 mol/L, so that a succinic acid-nickel succinate buffer solution was used as a buffer solution for the nickel solution. As in Example 1, a proper amount of aqueous sodium hydroxide with a concentration of 10 mol/L was dripped in the nickel solution to adjust the pH to 5.6, and further, water was added to the pH-adjusted nickel solution so that a total amount of the solution became 100 mL.

Comparative Example 3

A nickel film was formed as in Example 1. This example differs from Example 1 in that in the production of a nickel solution, instead of an acetic acid-sodium acetate buffer solution, a 40.2 ml boric acid aqueous solution with a concentration of 1.25 mol/L was poured into a 58.4 mL nickel sulfate ion aqueous solution with a concentration of 1.71 mol/L. As in Example 1, a proper amount of aqueous sodium hydroxide with a concentration of 10 mol/L was dripped in the nickel solution to adjust the pH to 5.6, and further, water was added to the pH-adjusted nickel solution so that a total amount of the solution became 100 mL.

<Evaluation Method>

The number of non-deposited portions (pinholes) and the number of burns in each of the surfaces of the nickel films formed in Examples 1 to 3 and Comparative Examples 1 to 3, as well as the area rates thereof were measured. In addition, the pH of the nickel solution after the formation of the film was also measured to determine variation of the pH. Table 1 shows the results. Each mol concentration shown in Table 1 is the mol concentration after water was added to the pH-adjusted solution.

Example 4

A nickel film was formed as in Example 1. This example differs from Example 1 in that a nickel solution containing an acetic acid-nickel acetate buffer solution was produced by adding acetic acid and nickel acetate to a 1M nickel chloride aqueous solution so that the concentration of nickel ions became 1 mol/L, the concentration of acetic acid ions became 0.5 mol/L, and the pH of the nickel solution became 6. Further, using such a nickel solution for forming a film, the nickel deposited amount of a nickel film obtained at current densities of 60 mA/cm$^2$, 80 mA/cm$^2$, and 100 mA/cm$^2$ was quantitatively measured through ICP emission analysis, and the current efficiency shown below was cal-

TABLE 1

| | | Example 1 | Example 2 | Example 3 | Comparative Example 1 | Comparative Example 2 | Comparative Example 3 |
|---|---|---|---|---|---|---|---|
| Nickel Compound | Nickel Sulfate | 1.0 mol/L | | 1.0 mol/L | 1.0 mol/L | | 1.0 mol/L |
| | Nickel Sulfamate | | 1.0 mol/L | | | 1.0 mol/L | |
| Buffer Solution | Acetic Acid-Sodium Acetate | 0.5 mol/L | 0.5 mol/L | | | | |
| | Succinic Acid-Nickel Succinate | | | 0.1 mol/L | | | |
| | Boric Acid-Nickel Borate | | | | | | 0.5 mol/L |
| Pinholes | Number (Portions) | Zero | Zero | Zero | 63 | 42 | 69 |
| | Area Rate (%) | Zero | Zero | Zero | 20.17 | 17.26 | 19.23 |
| Burns | Number (Portions) | Zero | Zero | Zero | 12 | 17 | 15 |
| | Area Rate (%) | Zero | Zero | Zero | 1.17 | 15.13 | 10.21 |
| pH Variation (pH after Film Formation) | | −0.3 (5.3) | −0.4 (5.2) | −0.3 (5.3) | −3.1 (5.3) | −2.8 (5.3) | −0.2 (5.3) |

<Results and Consideration>

When Examples 1 to 3 are compared with Comparative Examples 1 to 3, it is found that the nickel films of Examples 1 to 3 have no pinholes or burns, whereas the nickel films of Comparative Examples 1 to 3 have pinholes and burns generated therein. It is also found that variation of the pH of the nickel solution after formation of the film of each of Examples 1 to 3 and Comparative Example 3 is less than those of Comparative Examples 1 and 2.

From the results of Example 1 and Comparative Example 1, it is considered that when a nickel solution contains a buffer solution as in Example 1, it is possible to form a uniform, homogeneous nickel film while suppressing generation of hydrogen gas during formation of the film.

From the results of Example 2 and Comparative Example 2, it is considered that when a nickel solution contains a different nickel compound dissolved therein, it is also possible to form a uniform, homogeneous nickel film while suppressing generation of hydrogen gas during formation of the film as in Example 1.

From the results of Example 3 and Comparative Example 3, it is considered that even when a nickel solution contains a buffer solution, if the buffer solution forms a boric acid-nickel complex as in Comparative Example 3, hydrogen is generated during formation of a film, with the result that pinholes and burns are generated.

Figure 6:
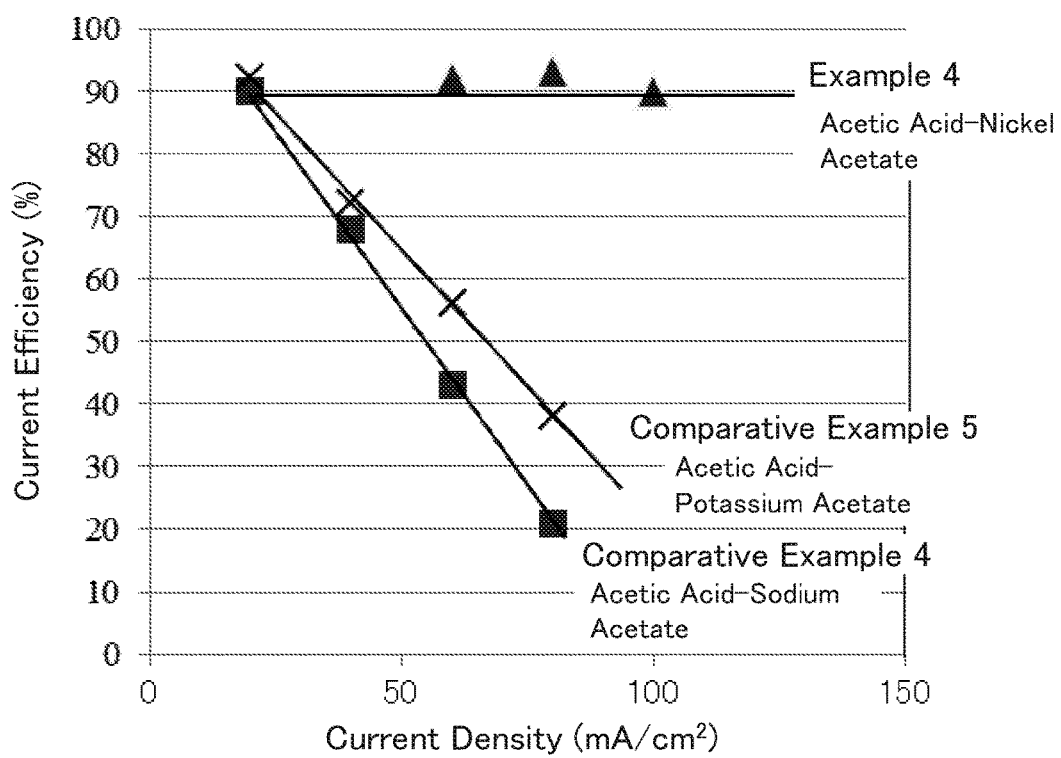
FIG. 6 is a chart showing the relationship between the current density and the current efficiency in accordance with Example 4, Comparative Example 4, and Comparative Example 5.

That is, it is considered that if a boric acid-nickel complex is formed in a nickel solution, boric acid ions cannot move to the surface of the cathode (i.e., substrate) due to the presence of the solid electrolyte membrane, and hydrogen gas is thus generated between the solid electrolyte membrane and the substrate, with the result that pinholes and burns are generated. Meanwhile, when a citric acid-nickel citrate buffer solution is used, it is also considered that similar phenomena to those that occur when a boric acid-nickel borate buffer solution is used occur.

culated from the deposited amount and the integral current amount. Table 2 and FIG. 6 show the results.

Current efficiency=nickel deposited amount[the number of atoms]/(integral current amount/2/Faraday constant)×100

Herein, the integral current is the amount of electric charge. When two electrons and one nickel ion are combined, nickel is reduced and thus is deposited. Electrons that are not used for the deposition of nickel are used to reduce hydrogen ions. That is, current efficiency being low means that wasted electricity (not for the deposition of nickel) is used, and thus is not preferable in terms of power consumption.

Comparative Example 4

A nickel film was formed as in Example 1. This example differs from Example 4 in that sodium acetate was added instead of nickel acetate so that an acetic acid-sodium acetate buffer solution was contained in the nickel solution. It should be noted that the nickel ion concentration, the acetic acid ion concentration, and the of the nickel solution are the same as those in Example 4.

Using such a nickel solution for forming a film, the current efficiency at current densities of 20 mA/cm$^2$, 40 mA/cm$^2$, 60 mA/cm$^2$, 80 mA/cm$^2$ was calculated with a method similar to that in Example 4. Table 2 and FIG. 6 show the results.

Comparative Example 5

A nickel film was formed as in Example 1. This example differs from Example 4 in that potassium acetate was added instead of nickel acetate so that an acetic acid-potassium acetate buffer solution was contained in the nickel solution. It should be noted that the nickel ion concentration, the acetic acid ion concentration, and the pH of the nickel solution are the same as those in Example 4.

Using such a nickel solution for forming a film, the current efficiency at current densities of 20 mA/cm², 40 mA/cm², 60 mA/cm², and 80 mA/cm² was calculated with a method similar to that in Example 4. Table 2 and FIG. 6 show the results.

Reference Example

Common nickel electroplating was performed and the current efficiency was calculated. A commercially available liquid (product of OKUNO CHEMICAL INDUSTRIES CO., LTD) was used as the type of a liquid. It should be noted that an acetic acid-sodium acetate is used as a pH buffer solution in a plating solution. The current efficiency at current densities of 20 mA/cm², 40 mA/cm², 60 mA/cm², 80 mA/cm², and 100 mA/cm² was calculated with a method similar to that in Example 4. Table 2 shows the results.

TABLE 2

| | | Current Density (mA/cm²) | | | | |
|---|---|---|---|---|---|---|
| | | 20 | 40 | 60 | 80 | 100 |
| Current Efficiency (%) | Example 4 | | | 92% | 93% | 90% |
| | Comparative Example 4 | 90% | 68% | 43% | 21% | |
| | Comparative Example 5 | 92% | 72% | 56% | 38% | |
| | Reference Example | 90% | 91% | 90% | 88% | 86% |

<Results and Consideration>

In Example 4, a decrease in the current efficiency was hardly seen even when the current density was increased, whereas a decrease in the current efficiency was seen in each of Comparative Example 4 and Comparative Example 5. When the metal ion concentration in the solid electrolyte membrane of each of Comparative Example 4 and Comparative Example 5 was measured through ICP emission analysis, not only nickel ions (9.2 μmol) but also sodium ions (9.6 μmol) were detected in Comparative Example 4, and potassium ions (10.0 μmol) were detected in Comparative Example 5.

Thus, in Comparative Example 4, the solid electrolyte membrane contains nickel ions and sodium ions. Although the nickel ions are consumed through deposition, sodium with higher ionization tendency than nickel remains in the ionic state in the solid electrolyte membrane. Consequently, it is considered that as the sodium ions are present on the movement path of the nickel ions, and thus disturb movement of the nickel ions, the current efficiency significantly decreases.

Meanwhile, in Comparative Example 5, potassium also has higher ionization tendency than nickel. Thus, the potassium ions also remain in the solid electrolyte membrane like the aforementioned sodium ions. Consequently, movement of the nickel ions is disturbed, and the current efficiency significantly decreases.

It should be noted that in the reference example, a film was formed through electroplating without using a solid electrolyte membrane. Thus, the current efficiency hardly changes even when a pH buffer solution contains sodium ions.

Although the embodiments of the present invention have been described in detail, the present invention is not limited thereto, and a variety of design changes is possible within the spirit and scope of the present invention recited in the appended claims.

Although an anode made of a porous body was used as the anode in the present embodiment, a porous body need not be used for the anode as long as nickel ions can be favorably supplied to the solid electrolyte membrane. For example, a nickel solution may be supplied between the anode and the solid electrolyte membrane.

REFERENCE SIGNS LIST

1A Film-forming apparatus
11 Anode
13 Solid electrolyte membrane
14 Power supply unit
15 Housing (metal ion supply part)
15a Supply flow path
15b Discharge flow path
16 Pressurization means
17 Solution tank
17a Supply pipe
18 Waste liquid tank
18a Waste liquid pipe
19 Contact pressurization part
21 Base
B Substrate (cathode)
E Film-forming region
F Nickel film
L Nickel solution

The invention claimed is:

1. A method for forming a nickel film comprising:
disposing a solid electrolyte membrane between an anode and a substrate that functions as a cathode,
bringing a nickel solution containing a pH buffer solution into contact with the solid electrolyte membrane, thereby supplying nickel ions to the solid electrolyte membrane,
bringing the solid electrolyte membrane into contact with the substrate, and
applying a voltage across the anode and the substrate to deposit nickel onto a surface of the substrate from the nickel ions contained in the nickel solution in the solid electrolyte membrane to form a nickel film containing the nickel on the surface of the substrate, wherein
a pH of the nickel solution is in a range of 4.2 to 6.1,
wherein the pH buffer solution has a buffer function in the range of the pH and does not form insoluble salts or complexes with the nickel ions during formation of the film,
the pH buffer solution is an acetic acid-acetate buffer solution or a succinic acid-succinate buffer solution and the pH buffer solution contains no sodium ions or potassium ions, and
wherein the nickel ions in the nickel solution move through the solid electrolyte membrane from a side of the solid electrolyte membrane facing the anode to a side of the solid electrolyte membrane facing the cathode.

2. The method according to claim 1, wherein cations contained in the pH buffer solution are nickel ions or ions of metal with lower ionization tendency than nickel.

3. The method according to claim 1, wherein the pH buffer solution is one of an acetic acid-nickel acetate buffer solution or a succinic acid-nickel succinate buffer solution.

4. The method according to claim 1, further comprising flowing the nickel solution containing the pH buffer solution to the inside of the anode.

5. The method according to claim 1, wherein the anode is porous.

6. The method according to claim 1, wherein the solid electrolyte membrane is impregnated with nickel ions.

7. The method according to claim 1, wherein the solid electrolyte membrane is a fluorine-based resin, a hydrocarbon-based resin, a polyamic acid resin, or a resin with an ion exchange function.

8. The method according to claim 1, wherein the solid electrolyte membrane has a recess that covers the surface of the anode facing the solid electrolyte membrane.

* * * * *